United States Patent [19]
Lee et al.

[11] Patent Number: 5,712,534
[45] Date of Patent: *Jan. 27, 1998

[54] HIGH RESISTANCE RESISTORS FOR LIMITING CATHODE CURRENT IN FIELD EMMISION DISPLAYS

[75] Inventors: John Kichul Lee; David A. Cathey, Jr.; Kevin Tjaden, all of Boise, Id.

[73] Assignee: Micron Display Technology, Inc., Boise, Id.

[*] Notice: The term of this patent shall not extend beyond the expiration date of Pat. No. 5,585,301.

[21] Appl. No.: 688,098

[22] Filed: Jul. 29, 1996

Related U.S. Application Data

[63] Continuation of Ser. No. 502,388, Jul. 14, 1995, Pat. No. 5,585,301.

[51] Int. Cl.$^6$ .................................................. H01J 1/30
[52] U.S. Cl. ..................... 315/169.3; 313/309; 313/336
[58] Field of Search .................... 315/169.1, 169.3; 313/307, 308, 309, 351, 336

[56] References Cited

U.S. PATENT DOCUMENTS

| | | | |
|---|---|---|---|
| 3,500,102 | 3/1970 | Crost et al. | 313/109 |
| 3,671,798 | 6/1972 | Lees | 313/336 |
| 3,814,968 | 6/1974 | Nathanson et al. | 313/95 |
| 3,970,887 | 7/1976 | Smith et al. | 313/306 |
| 4,370,797 | 2/1983 | VanGorkom et al. | 437/916 |
| 4,940,916 | 7/1990 | Borel et al. | 313/306 |
| 5,142,184 | 8/1992 | Kane | 313/309 |
| 5,151,061 | 9/1992 | Sandhu | 445/24 |
| 5,162,704 | 11/1992 | Kobori et al. | 315/349 |
| 5,186,670 | 2/1993 | Doan et al. | 445/24 |
| 5,210,472 | 5/1993 | Casper et al. | 315/349 |
| 5,212,426 | 5/1993 | Kane | 315/169 |
| 5,283,500 | 2/1994 | Kochanski | 315/58 |
| 5,319,233 | 6/1994 | Kane | 313/308 |
| 5,359,256 | 10/1994 | Gray | 313/169 |
| 5,378,962 | 1/1995 | Gray et al. | 313/495 |
| 5,455,196 | 10/1995 | Frazier | 437/916 |
| 5,502,347 | 3/1996 | Dworsky et al. | 313/309 |
| 5,525,857 | 6/1996 | Gnade et al. | 313/309 |
| 5,550,426 | 8/1996 | Smith et al. | 313/309 X |
| 5,572,041 | 11/1996 | Betsui et al. | 313/307 X |
| 5,578,896 | 11/1996 | Huang | 313/309 |
| 5,585,301 | 12/1996 | Lee et al. | 437/60 |

OTHER PUBLICATIONS

*Current Limiting of Field Emitter Array Cathodes*, Kon Jiun Lee, Georgia Institute of Technology, Aug., 1986, p. 162.

*Active Control of Emission Current of Field Emitter Array*, Yokoo, K. et al., Research Institute of Electrical Communication, Tohoku University, Japan, 1994, pp. 58–61.

Seal Vacuum Devices, Fluorescent Microtip Displays, A. Ghis et al., IEEE Transactions on Electron Devices, vol. 38 No. 10, Oct. 1991, pp. 2320–2323.

Field Emission Displays, David A. Cathey, Jr. Published in VLSI, Taiwan, May–Jun., 1995.

*Primary Examiner*—Robert Pascal
*Assistant Examiner*—Justin P. Bettendorf
*Attorney, Agent, or Firm*—Stephen A. Gratton

[57] ABSTRACT

A high resistance resistor for regulating current in a field emission display is integrated into circuitry of the field emission display. The resistor is in electrical communication with emitter sites for the field emission display and with other circuit components such as ground. The high resistance resistor can be formed as a layer of a high resistivity material, such as intrinsic polycrystalline silicon, polycrystalline silicon doped with a conductivity-degrading dopant, lightly doped polysilicon, titanium oxynitride, tantalum oxynitride or a glass type material deposited on a baseplate of the field emission display. Contacts are formed in the high resistivity material to establish electrical communication between the resistor and the emitter sites and between the resistor and the other circuit components. The contacts can be formed as low resistance contacts (e.g., ohmic contacts) or as high resistance contacts (e.g., Schottky contacts).

34 Claims, 2 Drawing Sheets

HIGH RESISTANCE RESISTORS FOR LIMITING CATHODE CURRENT IN FIELD EMMISION DISPLAYS

CROSS REFERENCE TO RELATED APPLICATIONS

This application is a continuation of application Ser. No. 08/502,388 filed Jul. 14, 1995, U.S. Pat. No. 5,585,301.

This invention was made with Government support under Contract No. DABT63-93-C-0025 awarded by Advanced Research Projects Agency (ARPA). The Government has certain rights in this invention.

FIELD OF THE INVENTION

This invention relates to flat panel displays and more particularly to a method for forming resistors for limiting cathode current in field emission displays (FEDs).

BACKGROUND OF THE INVENTION

Flat panel displays have recently been developed for visually displaying information generated by computers and other electronic devices. Typically, these displays are lighter and utilize less power than conventional cathode ray tube (CRT) displays. One type of flat panel display is known as a cold cathode field emission display (FED).

A field emission display uses electron emissions to generate a visual image. The field emission display includes a baseplate and a faceplate. The baseplate includes arrays of emitter sites associated with corresponding pixel sites on the faceplate. Each emitter site is typically formed as a sharpened projection, such as a pointed apex or a sharp edged blade. The baseplate is separated from the faceplate by a vacuum gap. A gate electrode structure, or grid, is associated with the emitter sites and functions to provide the intense electric field required for generating electron emission from the emitter sites. When a sufficient voltage differential is established between the emitter sites and grid, a Fowler-Nordheim electron emission is initiated. The emitted electrons strike and excite cathodoluminescent phosphors contained on the face plate. This releases photons thereby providing a light image that can be seen by a viewer. The current flow from the baseplate to the emitter sites is termed the "cathode current" and the electron flow from the emitter sites to the faceplate is termed the "emission current".

The baseplate of a field emission display includes arrays of emitter sites and circuitry for addressing the arrays and activating electron emission from the emitter sites. The baseplate can include a substrate formed of silicon or a hybrid material such as silicon on glass. Different techniques have been developed in the art for addressing the arrays and for activating electron emission from the emitter sites. In addition, a technique must be employed to achieve variations in display brightness when the emitter sites are activated. One such technique is to vary the charge delivered by an emission array in a given frame. Another technique is to vary the emission current produced during activation by varying the cathode current.

One problem with either technique is that the emitter sites of an array can produce significantly different emission currents as a result of small variations in geometry and surface morphology. These variations in emission current tend to degrade the quality of the image. Some of this image variation can be controlled by fabricating emitter sites with a high degree of uniformity and by forming a large number of emitter sites for each pixel site of the display face. Further image improvement can be achieved electrically by operating the emitter sites with a grid capable of producing higher than the desired electron emission current and then limiting or regulating the cathode current supplied to the emitter sites. A wide variety of passive and active current limiting approaches are taught by the prior art.

One such approach is to form electrical resistors in series with the individual emitter sites and arrays of emitter sites. This technique is described in U.S. Pat. No. 3,671,798 to Lees entitled "Method and Apparatus Limiting Field Emission Current". Another example of this approach is described in U.S. Pat. No. 5,283,500 to Kochanski wherein a patterned resistive material is formed in the electrical path to limit cathode current to the emitter sites. One other technique is to deposit a silicon resistive layer on the baseplate subjacent to the emitter sites to limit cathode current to the emitter sites. This technique is described in the 1986 Ph.D. thesis by Dr. Kon Jiun Lee entitled "Current Limiting of Field Emitter Array Cathodes". Another article by Ghis et al published in IEEE, vol 38, no. 10 (October 1991) entitled "Sealed Vacuum Devices Fluorescent Microtip Displays" also discloses series resistors to limit cathode current.

The present invention is directed to improved methods for forming high resistance resistors for limiting cathode current to the emitter sites of a field emission display. Accordingly, it is an object of the present invention to provide improved methods for forming high resistance resistors for regulating cathode current in field emission displays and other flat panel displays.

It is a further object of the present invention to provide improved methods of current regulation for field emission displays using high resistance resistors included in a baseplate of the field emission display.

It is still another object of the present invention to provide improved resistors for field emission displays that are simple, adaptable to large scale manufacture and which can optionally be formed with low resistance ohmic contacts.

Other objects, advantages and capabilities of the present invention will become more apparent as the description proceeds.

SUMMARY OF THE INVENTION

In accordance with the present invention an improved method for forming high resistance resistors for controlling cathode current in field emission displays (FEDs) is provided. The method of the invention forms a resistor out of a high resistivity material deposited on a baseplate of the FED and electrically connected in series to a field emitter site of the field emission display. A total resistance of the resistor is a function of the resistivity of the resistor material and of the geometry of the resistor. In addition, the total resistance of the resistor is a function of the contact resistance for the contacts which electrically connect the resistor in series with the emitter sites and other circuit components (e.g., ground). The contacts for the resistor can be formed with a low resistance (e.g., ohmic contacts) or with a high resistance (e.g., Schottky contacts). In the case of high resistance contacts, the contact resistance contributes significantly to a total resistance of the resistor.

Preferred materials for fabricating the resistors have a high resistivity to limit the cathodic current levels, which are frequently in the nA range. Suitable materials include intrinsic polycrystalline silicon (e.g., polysilicon or lightly doped polysilicon); semi-insulating polycrystalline silicon (SIPOS) having a conductivity-degrading impurity such as nitrogen or oxygen; other high resistivity materials such as titanium oxynitride and tantalum oxynitride; and glass type materials such as chromium oxide and titanium oxide. A desired resistivity for the high resistance resistor will be on the order of $10^7$–$10^9$ ohm/square or higher but will vary according to the cathode current requirements of the field emission display per pixel.

The baseplate for the field emission display can be formed as a layer of single crystal silicon. Alternately the baseplate can be formed as amorphous or microcrystalline silicon islands deposited on an underlying substrate formed of glass or other insulating material.

DETAILED DESCRIPTION OF THE PREFERRED EMBODIMENT

Figure 1:
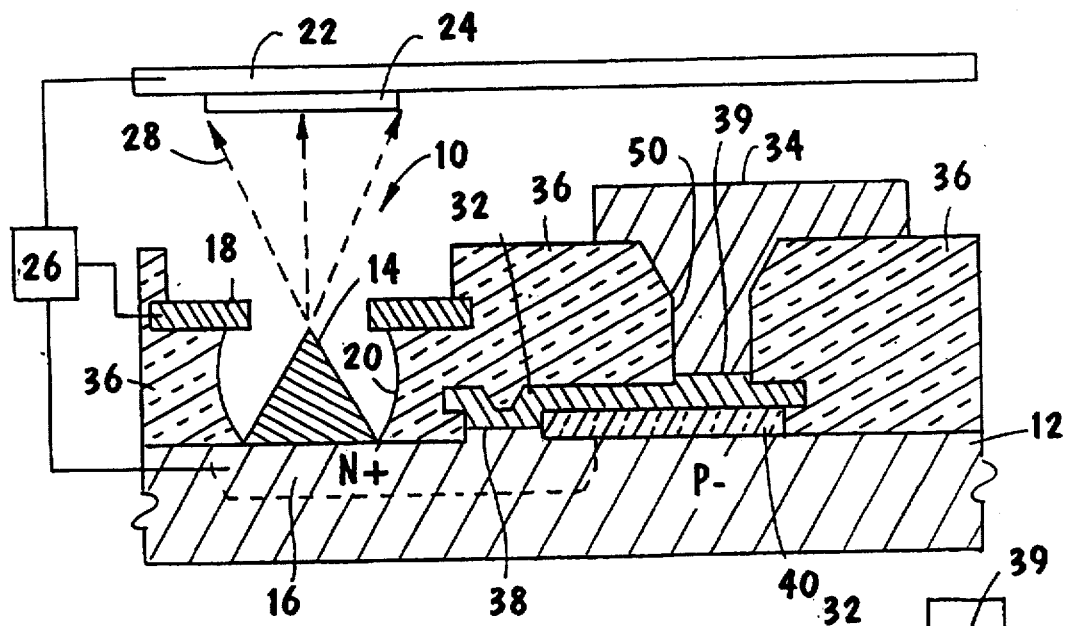
FIG. 1 is a schematic cross sectional view of a portion of a field emission display (FED) having a high resistance resistor constructed in accordance with the invention as a deposited layer.

Referring now to FIG. 1, a portion of a pixel 10 of a field emission display (FED) is illustrated schematically. The FED pixel 10 includes a baseplate 12 formed as a layer of single crystal P-type silicon. The emitter site 14 may be formed and sharpened using techniques that are known in the art. The surface of the baseplate 12 is patterned and etched to form emitter sites 14. Each emitter site 14 (or array of emitter sites 14) is formed on an N-tank conductivity region 16 of the baseplate 12. The N-tank conductivity region 16 and P-type silicon baseplate 12 form a semiconductor P/N junction.

Surrounding the emitter site 14 is a gate electrode structure or grid 18. The grid 18 is formed of a conductive material such as doped polysilicon, silicided polysilicon, or a metal such as chromium or molybdenum. The grid 18 is separated from the baseplate 12 by a multi level oxide layer 36. The multi level oxide 36 may be formed in multiple layers out of a material such as silicon dioxide, silicon nitride or silicon oxynitride. The multi level oxide 36 includes an etched cavity 20 for the emitter site 14.

A faceplate 22 is aligned with the emitter site 14 and includes a phosphor coating 24 in the path of electrons 28 emitted by the emitter site 14. An electrical source 26 is electrically connected to the emitter site 14 which functions as the cathode. The electrical source 26 is also electrically connected to the grid 18 which functions as a gate element. In addition, the electrical source 26 is electrically connected to the faceplate 22 which functions as the anode.

When a voltage differential is generated by the source 26 between the emitter site 14 and the grid 18, electrons 28 are emitted by the emitter site 14. These electrons 28 strike the phosphor coating 24 on the faceplate 22. This produces photons and a visual image.

For all of the circuit elements described thus far, fabrication processes that are known in the art can be utilized to form the FED pixel 10. By way of example, U.S. Pat. Nos. 5,151,061, 5,186,670, and 5,210,472, incorporated herein by reference, disclose methods for forming the above described components of a field emission display (e.g., baseplate 12, emitter sites 14, grid 18, faceplate 22).

As shown in FIG. 1, a high resistance resistor 32 is formed on the baseplate 12 by deposition of high resistivity material. The resistor 32 is insulated from the baseplate 12 by a thin insulating layer 40 formed of a material such as $SiO_2$. The resistor 32 is electrically connected to the N-type conductivity region 16 for the emitter site 14 using a first contact 38. In addition, the resistor 32 is electrically connected to an interconnect 34 using a second contact 39. The interconnect 34 is a conductive trace formed of a conductive metal such as aluminum, tungsten or titanium or as a conductive film such as doped or silicided polysilicon. The interconnect 34 is electrically connected to other circuit components of the FED pixel 10 such as ground bus or an electrically activated bias level. A via 50 is formed in the multi level oxide layer 36 for connecting the interconnect 34 to the high resistance resistor 32.

The resistor 32 is formed of a material having a high resistivity. The resistance of the resistor 32 will be a function of the material resistivity as well as its dimensions. In semiconductor structures, the resistance of a thin layer is specified as sheet resistance Rs and is measured using a four point probe measurement. The sheet resistance Rs has the units of ohms/square ($\Omega$/sq.). Sheet resistance (Rs) is approximately equal to 4.53 V/I, where 4.53 is a constant that arises from the probe spacing.

A desired range of values for the sheet resistance Rs of the high resistance resistor 32 is from $10^7$ ohm/sq to $10^9$ ohm/sq. A preferred value for the sheet resistance Rs is on the order of $10^8$ ohm/sq.

Polysilicon is resistive but is made less resistive when doped with a dopant such as phosphorous when layered with a conductive silicide. In the present case the goal is a highly resistive layer of material. Accordingly, undoped or intrinsic polysilicon resistors can be formed. Undoped or intrinsic polysilicon resistors having a thickness of about 0.5 µm will have a sheet resistance Rs of higher than about $10^9$ ohm/sq. The current limit for such a high resistance resistor 32 will be on the order of nanoamperes nA for up to medium potential applications (i.e. less than 100 volts). Another design consideration is that the reverse biased leakage of the isolated N-tank conductivity region 16 to the baseplate 12 has to be much lower than the current limit range or typically less than a few picoamps.

In addition to intrinsic or doped polysilicon, other high resistivity materials can be used to form the resistor 32. As an example, the resistor 32 may be formed of semi-insulating polycrystalline silicon (i.e., SIPOS) containing a conductivity-degrading dopant such as oxygen, nitrogen and compounds thereof. In general, polysilicon doped with these elements remains highly resistive. The resistor 32 can also be formed of lightly doped silicon.

Other suitable materials include tantalum oxynitride ($TaN_xO_y$) and titanium oxynitride ($TiN_xO_y$). In these compounds the ratio of nitrogen to oxygen is in the range of about one-to-two to two-to-one (i.e., x=1 to 2, y=1 to 2). In general, such materials may be deposited with a ratio of elements that provides a desired material resistivity. The resistor 32 can also be formed of a highly resistive glass type material such as chromium oxide, manganese oxide or titanium oxide.

The total resistance ($R_T$) of the resistor 32, in addition to depending on the sheet resistance ($R_S$) will also depend on the contact resistance ($R_{C1}$) of the contact 38 which electrically connects the resistor 32 to the conductivity region 16 and the resistance ($R_{C2}$) of the contact 39 which electrically connects the resistor 32 to the interconnect 34. Expressed mathematically the total resistance $R_T$ of the resistor 32 is equal to $R_S+R_{C1}+R_{C2}$.

The contacts 38 and 39 can be formed as low resistance nonrectifying contacts or as non-ohmic rectifying contacts. With low resistance contacts, essentially all of the total resistance ($R_T$) is provided by the high resistance resistor 32 itself.

Figure 1A:
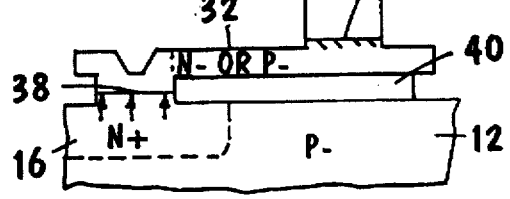
FIG. 1A is a schematic view of a portion of FIG. 1 illustrating the formation of the high resistance resistor shown in FIG. 1 with low resistance contacts.

Low resistance contacts can be formed by treating the contact regions of the resistor 32 with dopants prior to formation of the interconnect 34. This is shown schematically in FIG. 1A. In the case where the resistor 32 is formed of a silicon based material (e.g., intrinsic or lightly doped polysilicon, amorphous silicon) an N+ dopant (e.g., phosphorus) from the N-tank conductivity region 16 of the baseplate 12 diffuses into the contact 38 to form a low resistance contact. The silicon based material which forms the resistor 32 can then be doped with either an N-type or a P-type dopant to meet the resistance requirements of the resistor 32 and to form contact 39. If the silicon based material is doped with an N-type dopant, the sheet resistance ($R_S$) is determined by the sheet resistance of the N-layer. If the silicon based material is doped with a P– dopant then the sheet resistance ($R_S$) is determined by the reverse N+/P– junction leakage mechanism.

The contacts 38 and 39 can also be formed as high resistance contacts. As an example, a lightly doped semiconductor material (e.g., intrinsic or lightly doped polysilicon) can be used to form a Schottky contact. In addition, the resistor 32 can be formed of a highly resistive glass type material (e.g., chromium oxide, manganese oxide or titanium oxide) to form the contacts 38 and 39 with a high resistance. In either case, the high contact resistance of contacts 38 and 39 will contribute significantly to the total resistance ($R_T$) for the resistor.

A representative process sequence for forming the FED pixel 10 with the high resistance resistor 32 is as follows:

1. Form N-tank conductivity regions 16 for the emitter sites 14 by patterning and doping a single crystal silicon baseplate 12.
2. Form electron emitter sites 14 by masking and etching the silicon baseplate 12.
3. Oxidation sharpen the emitter sites 14 using a suitable oxidation process.
4. Form the thin insulating layer 40 for the high resistance resistor 32. The thin insulating layer 40 can be a layer of silicon dioxide formed by oxidizing the silicon baseplate 12.
5. Post-contact clean preparation and form the contact 38 to the N-tank conductivity region 16.
6. Form the high resistance resistor 32 using a suitable deposition process, such as CVD or sputtering, to deposit a layer of a high resistivity material such as intrinsic polycrystalline silicon, polysilicon doped with oxygen or nitrogen, tantalum oxynitride ($TaN_xO_y$) or titanium oxynitride ($TiN_xO_y$) or a glass type material over the contact 38.
7. Form one level of the multi level oxide layer 36 by the conformal deposition of an insulator such as silicon dioxide, silicon nitride or silicon oxynitride.
8. Form the grid 18 by deposition of doped polysilicon doped with a conductivity dopant such as phosphorous. Other conductive materials such as chromium, molybdenum and other metals may also be used.
9. CMP the grid to form self aligned features (see U.S. Pat. No. 5,186,670).
10. Photopattern and dry etch the grid 18.
11. Form another level of the multi level oxide layer 36 on the grid 18, photopattern and etch vias 50.
12. Pre-contact clean preparation and form the contact 39 between the high resistance resistor 32 and the interconnect 34.
13. Form interconnect 34 to ground by deposition of a suitable conductive material such as aluminum.
14. Form openings through the grid 18 for the emitter sites 14. Depending on the grid material this may be accomplished using photopatterning and wet etching. For a polysilicon grid 18 and silicon emitter sites 14 having a layer of silicon dioxide, one suitable wet etchant is diluted HF acid.
15. Etch the multi level oxide layer 36 to open the cavity 20 for the emitter site 14 using a wet etch process. For a multi level oxide layer 36 formed of silicon dioxide a buffered solution of HF can be used to etch the cavity 20.

Figure 2:
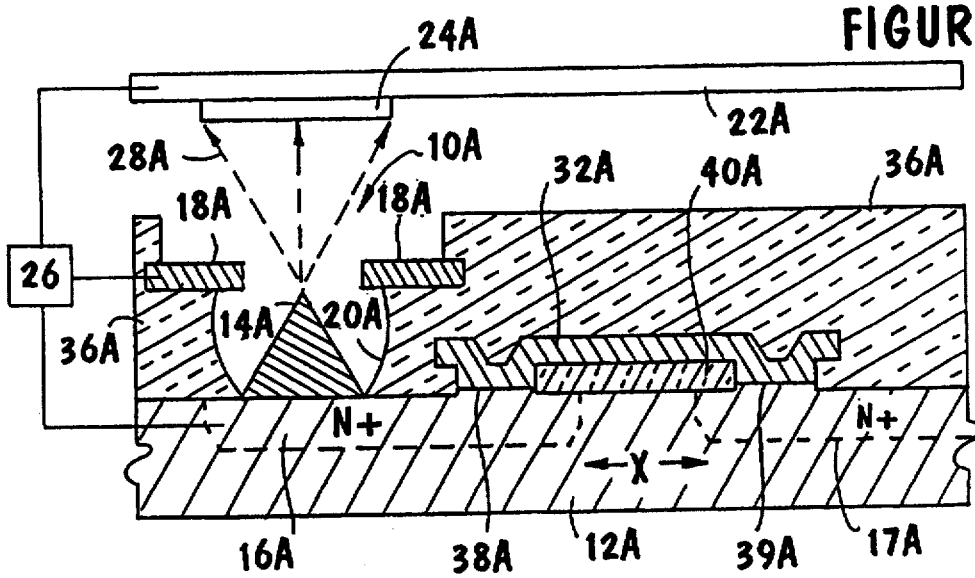
FIG. 2 is a schematic cross sectional view of a portion of a field emission display (FED) having a high resistance resistor constructed in accordance with the invention as a deposited layer connected to a N-diffused conductivity region.

Referring now to FIG. 2, a FED pixel 10A constructed in accordance with an alternate embodiment of the invention is shown. In the alternate embodiment a high resistance resistor 32A rather than being connected to an interconnect 34 is connected to an isolated N-diffused conductivity region 17A formed in the substrate 12A. The resistor 32A is thus located between the N-tank conductivity region 16A for the emitter site 14A and an adjacent N-diffused conductivity region 17A. The N-diffused conductivity region 17A must be isolated from the remainder of the baseplate 12A and connect to other circuit components such as ground or an electrically activated bias level.

The high resistance resistor 32A is formed substantially as previously described. A thin insulating layer 40A, comprising an insulating material such as $SiO_2$, is formed between the high resistance resistor 32A and the baseplate 12A. A multi level oxide 36A insulates the grid 18A from the baseplate 12A.

The high resistance resistor 32A includes a first contact 38A formed between the resistor 32A and the N-tank conductivity region 16A for the emitter site 14A. In addition the high resistance resistor 32A includes a second contact 39A formed between the resistor 32A and an adjacent N-diffused conductivity region 17A on the baseplate 12A.

Figure 2A:
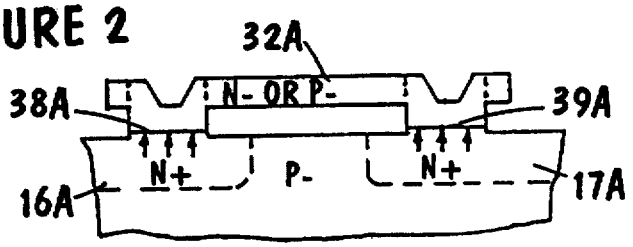
FIG. 2A is a schematic cross sectional view of a portion of FIG. 2 illustrating the formation of the high resistance resistor shown in FIG. 2 with low resistance contacts.

As shown in FIG. 2A the resistor 32A can be formed of a silicon based material (either N− or P−). In this case dopants from the conductivity regions 16A and 17A can diffuse into the resistor 32A to form the contacts 38A and 39A as low resistance ohmic contacts. If the resistor 32A is doped as P− it will form an N+/P−/N+ back to back diode structure having current limiting characteristics.

One additional design consideration for the embodiment of FIG. 2 is that the spacing "x" between the N-tank conductivity regions 16A and N-diffused conductivity region 17A, must be adjusted to avoid punch through and current leakage occurring as a result of the small dimensions. This current leakage will also be a function of the voltage potential that is applied to the emitter site 14.

Figure 3:
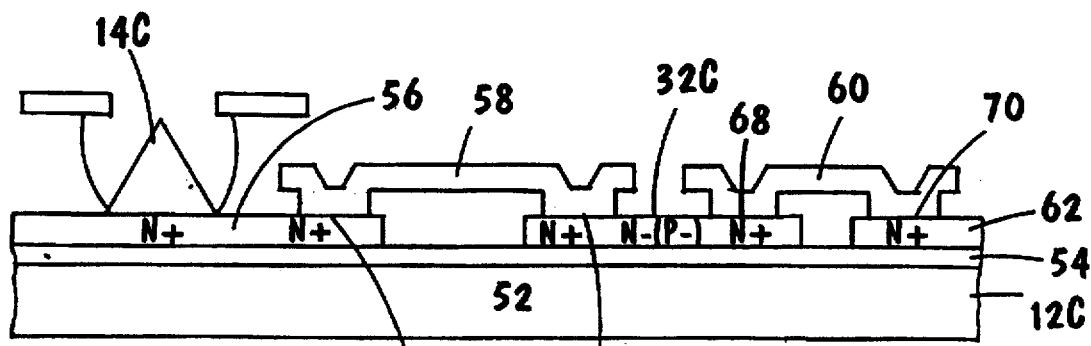
FIG. 3 is a schematic view of an alternate embodiment of the invention illustrating the formation a high resistance resistor on a baseplate comprising isolated silicon containing islands on a glass substrate.

Referring now to FIG. 3 an alternate embodiment high resistance resistor 32C is shown. The high resistance resistor 32C is formed on a baseplate 12C comprising a glass substrate 52 and a barrier layer 54 (e.g., $SiO_2$, $SiN_4$). The glass substrate 52 can be formed of soda-lime glass, borosilicate glass, quartz or other types of glass having suitable insulating and mechanical characteristics. The barrier layer 54 can be deposited on the glass substrate 52 using a deposition process such as plasma enhanced chemical vapor deposition (PECVD).

An emitter site 14C is formed on an isolated silicon island 56 formed on the barrier layer 54. The silicon island 56 is formed as a layer of amorphous silicon doped with an N+ dopant such as phosphorus. The isolated silicon island 56 can be formed by depositing and etching amorphous silicon or microcystalline silicon with and insulating layer ($SiO_2$) between the islands 56.

A first interconnect 58 formed of a conductive material electrically connects to the silicon island 56 via contact 64 and to the high resistance resistor 32C via contact 66. A second interconnect 60 formed of a conductive material electrically connects the high resistance resistor 32C to another isolated silicon island 62 via contacts 68 and 70. The isolated silicon island 62 is also doped N+ and can be electrically connected to other circuit components (e.g., ground).

The high resistance resistor 32C can be formed substantially as previously described by depositing a high resistance material onto the barrier layer 54. Depending on the material requirements and the dopants used the resistor 32C can be a continuous N− type, N+/N−/N+ type, N+/P− reverse junction, or N+/P−/N+ back to back diode. In each case the total resistance ($R_T$) will be a function of the resistor material and of the contacts 66, 68. In addition, for a high resistance resistor 32C formed of a glass type material as previously described the contacts 66, 68 can be formed as high resistance contacts.

A process flow for forming the high resistance resistor 32C shown in FIG. 3 is as follows:

1. Form glass substrate 52 and perform initial clean.
2. Form barrier layer 54. The barrier layer 54 can be a layer of $SiO_2$ deposited by PECVD.
3. Deposit a conductive layer on the barrier layer 54 for forming islands 56, 62. The conductive layer can be a silicon containing layer deposited by PECVD. The conductive layer could also be another conductive material such as a metal.
4. Deposit a material for forming the emitter sites 14C. This material can be amorphous silicon or another conductive material such as a metal. Photopattern and etch this material to form the emitter sites 14C.
5. Photopattern and etch conductive layer (step 3) to form islands 56 and 62. For silicon containing islands 56 and 62, a dry etch process with a fluorine or chlorine based chemistry can be used (e.g., $CF_4$, $CHF_3$, $C_2F_6$, $C_3F_8$). In this case a layer of resist covers the emitter sites 14C.
6. Strip the resist.
7. Deposit a dielectric material to isolate the islands 62.
8. Open contact vias to islands 56 and 62 for contacts 64, 70.
9. Form high resistance resistor 32C using the process previously described. In addition the metal interconnects 58 and 60 and contacts 66, 68 can be formed and isolated with a multi level insulator as previously described. The conductive layer which is initially deposited to form the islands 56 and 62 can also be used to form interconnects to the resistor 32C.

Figure 4A:
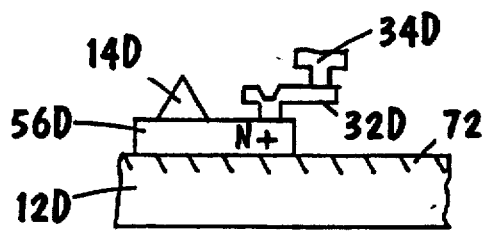
FIG. 4A is a schematic view of a high resistance resistor equivalent to the resistor shown in FIG. 1 formed on a baseplate including isolated silicon islands on a glass substrate.

Referring now to FIG. 4A a high resistance resistor 32D can also be formed using "on-glass" technology. The embodiment shown in FIG. 4A is equivalent to the embodiment of FIG. 1 but includes an emitter site 14D formed on an isolated silicon island 56D. The isolated silicon island 56D is formed on a baseplate 12D formed of glass with an intrinsic barrier layer 72 such as $SiO_2$ deposited by PECVD.

Figure 4B:
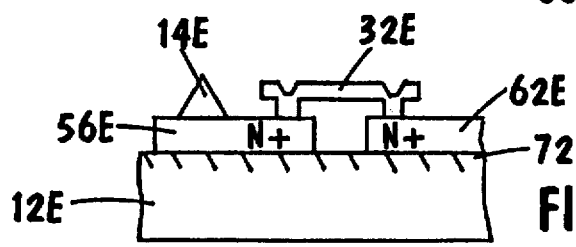
FIG. 4B is a schematic view of a high resistance resistor equivalent to the resistor shown in FIG. 2 formed on a baseplate including isolated silicon containing islands on a glass substrate.

FIG. 4B is equivalent to the embodiment shown in FIG. 2, but includes an emitter site 56E formed on an isolated silicon island 56E and a baseplate 12E formed of glass with an intrinsic barrier layer 72. The high resistance resistor 32E is electrically connected to the isolated silicon island 56E and to another isolated silicon island 62E.

Figure 5:
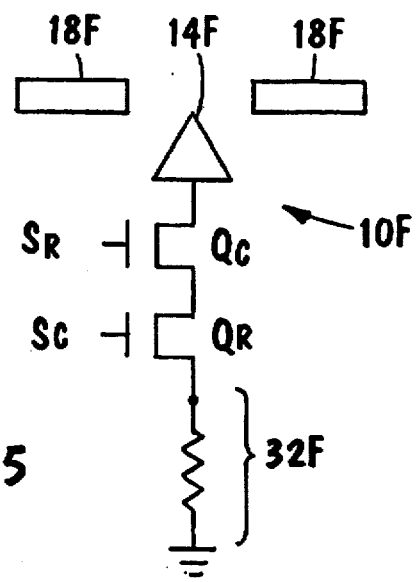
FIG. 5 is an electrical schematic illustrating an exemplary alternate embodiment of the invention in which high resistance resistors are incorporated into the control circuitry for the FED.

Referring now to FIG. 5, another alternate embodiment of the invention is illustrated. In the alternate embodiment of FIG. 5, the high resistance resistor 32F is formed integrally with integrated circuitry that controls the emitter site 14F. In order to induce field emission the emitter site 14F is coupled to a pair of series-coupled field effect transistors QC and QR. Transistor QC is gated by a column line signal SC, while transistor QR is gated by a row line signal QR. Standard logic signal voltages for CMOS, NMOS, and TTL are generally 5 volts or less, and may be used for both column and row signals. The emitter site 14F which is part of a pixel of a FED is turned off by turning off either or both of the series connected FETs (QC and QR). This circuit is described in more detail in the previously cited U.S. Pat. No. 5,210,472.

These solid state components may be fabricated by techniques that are known in the art. The high resistance resistor 32F is incorporated as part of this integrated circuitry. The high resistance resistor 32F functions to limit current to the emitter site 14F and to eliminate current run away in the FED pixel 10F.

Thus the invention provides an improved method for forming high resistance resistors for regulating and limiting current in flat panel displays. While the method of the invention has been described with reference to certain preferred embodiments, as will be apparent to those skilled in the art, certain changes and modifications can be make without departing from the scope of the invention as defined by the following claims.

What is claimed is:

1. A resistor in a field emission display comprising:
   a resistive layer formed on a baseplate of the field emission display;
   a first contact formed between the resistive layer and a conductivity region on the baseplate in electrical communication with an emitter site of the field emission display; and
   a second contact formed between the resistive layer and a second circuit component of the field emission display;

said resistive layer comprising a silicon based material;

said first or second contact comprising an ohmic contact formed by diffusion of a dopant from the conductivity region.

2. The resistor as claimed in claim 1 wherein a total resistance of the resistor is equal to a sheet resistance of the resistive layer, plus a first contact resistance of the first contact, plus a second contact resistance of the second contact.

3. The resistor as claimed in claim 1 wherein the resistive layer comprises a material selected from the group consisting of intrinsic polysilicon, polysilicon doped with a conductivity-degrading dopant, lightly doped polysilicon, and silicon.

4. The resistor as claimed in claim 1 further comprising doping the resistive material to achieve a desired resistance.

5. The resistor as claimed in claim 1 further comprising doping the resistive material with an N-type dopant to form an N-layer having a sheet resistance.

6. The resistor as claimed in claim 1 further comprising doping the resistive material with a P-dopant.

7. The resistor as claimed in claim 1 wherein the resistive layer comprises a lightly doped silicon containing material.

8. A resistor in a field emission display comprising:
a resistive layer formed on a baseplate of the field emission display;
a first contact formed between the resistive layer and a conductivity region on the baseplate in electrical communication with an emitter site of the field emission display; and
a second contact formed between the resistive layer and a second circuit component of the field emission display, said second contact in electrical communication with an isolated conductivity region on the baseplate.

9. A resistor in a field emission display comprising:
a resistive layer formed on a glass baseplate of the field emission display;
a first contact formed between the resistive layer and a conductivity region on the baseplate in electrical communication with an emitter site of the field emission display; and
a second contact formed between the resistive layer and a second circuit component of the field emission display, said emitter site comprising an isolated silicon island on the glass baseplate, said resistive layer comprising a silicon based material, and said first and second contacts comprising ohmic contacts.

10. The resistor as claimed in claim 9 wherein said first contact is formed by diffusion of dopants from the conductivity region.

11. A field emission display resistor comprising:
a resistive layer formed on a baseplate of a field emission display, said resistive layer comprising a silicon based material having a sheet resistance ($R_S$);
a first ohmic contact formed on the resistive layer in electrical communication with a conductivity region of a field emitter site for the field emission display, said first contact having a contact resistance ($R_{C1}$);
a second ohmic contact formed on the resistive layer in electrical communication with a second circuit component of the field emission display and having a contact resistance ($R_{C2}$);
such that a total resistance ($R_T$) of the resistor is equal to ($R_S$)+($R_{C1}$)+($R_{C2}$).

12. The resistor as claimed in claim 11 wherein the resistive layer comprises a material selected from the group consisting of silicon, intrinsic polysilicon, polysilicon doped with a conductivity-degrading dopant, and lightly doped polysilicon.

13. The resistor as claimed in claim 11 further comprising doping the resistive layer with an N-type dopant to form an N-layer having a sheet resistance.

14. The resistor as claimed in claim 11 further comprising doping the resistive layer with a P-type dopant.

15. The resistor as claimed in claim 11 wherein the first contact is formed by diffusion of dopants from the conductivity region.

16. The resistor as claimed in claim 11 wherein the resistive layer comprises a lightly doped silicon containing material.

17. The resistor as claimed in claim 11 wherein the second contact is electrically connected to an interconnect formed of a conductive material.

18. A field emission display resistor comprising:
a resistive layer formed on a baseplate of a field emission display, said resistive layer comprising an N- or P-doped silicon based material having a sheet resistance ($R_S$);
a first contact formed on the resistive layer in electrical communication with an N+ conductivity region of a field emitter site for the field emission display, said first contact having a contact resistance ($R_{C1}$);
a second contact formed on the resistive layer in electrical communication with a second circuit component of the field emission display and having a contact resistance ($R_{C2}$).

19. A field emission display resistor comprising:
a resistive layer formed on a baseplate of a field emission display, said resistive layer having a sheet resistance ($R_S$) of from $10^7$ ohm/sq to $10^9$ ohm/sq;
a first contact formed on the resistive layer in electrical communication with a conductivity region of a field emitter site for the field emission display, said first contact having a contact resistance ($R_{C1}$);
a second contact formed on the resistive layer, said second contact electrically connected to a second conductivity region formed on the baseplate, said second contact having a contact resistance ($R_{C2}$).

20. A field emission display resistor comprising:
a resistive layer formed on a field emission display, said resistive layer having a sheet resistance ($R_S$) of from $10^7$ ohm/sq to $10^9$ ohm/sq;
a first contact formed on the resistive layer in electrical communication with a conductivity region of a field emitter site for the field emission display, said conductivity region comprising an isolated silicon island on a glass substrate;
a second contact formed on the resistive layer, said second contact in electrical communication with a second circuit component of the field emission display.

21. The resistor as claimed in claim 20 wherein the second contact is in electrical communication with a second isolated silicon island formed on the substrate.

22. The resistor as claimed in claim 20 wherein the resistive layer comprises an insulating layer formed on a baseplate.

23. A field emission display comprising:
a baseplate having an emitter site formed thereon;
a resistor formed on the baseplate, said resistor comprising a silicon based resistive layer having a sheet resistance of ($R_S$) from $10^7$ ohm/sq to $10^9$ ohm/sq, a first ohmic contact formed between the resistive layer and the emitter site having a contact resistance of ($R_{C1}$), and a second ohmic contact formed between the resistive layer and a second circuit component of the field emission display having a contact resistance of ($R_{C2}$); with a total resistance ($R_T$) of the resistor equal to ($R_S$)+($R_{C1}$)+($R_{C2}$).

24. The field emission display as claimed in claim 23 wherein the resistive layer comprises a material selected from the group consisting of silicon, intrinsic polysilicon, polysilicon doped with a conductivity-degrading dopant, and lightly doped polysilicon.

25. The field emission display as claimed in claim 23 the resistive layer includes a dopant.

26. The field emission display as claimed in claim 23 wherein the baseplate includes a conductivity region in electrical communication with the emitter site and the first contact.

27. The field emission display as claimed in claim 23 wherein the second contact is in electrical communication with a second conductivity region on the baseplate.

28. The field emission display as claimed in claim 23 wherein the resistive layer comprises a lightly doped silicon containing material.

29. The field emission display as claimed in claim 23 wherein the second contact is electrically connected to an interconnect formed of a conductive material.

30. The field emission display as claimed in claim 23 and wherein a conductivity region of the emitter site is doped N+ and the resistive layer is doped N− or P−.

31. A field emission display comprising:

a baseplate having a first conductivity region in electrical communication with an emitter site, and a second conductivity region in electrical communication with a second circuit component;

a resistor formed on the baseplate, said resistor comprising a resistive layer having a sheet resistance ($R_S$) of from $10^7$ ohm/sq to $10^9$ ohm/sq;

a first contact between the resistive layer and the first conductivity region having a contact resistance of ($R_{C1}$); and a second contact between the resistive layer and the second conductivity region having a contact resistance of ($R_{C2}$).

32. The field emission display as claimed in claim 31 wherein the resistive layer comprises a material selected from the group consisting of intrinsic polysilicon, polysilicon doped with a conductivity-degrading dopant, lightly doped polysilicon, silicon, titanium oxynitride, tantalum oxynitride, and a glass type material.

33. The field emission display as claimed in claim 31 wherein a total resistance ($R_T$) of the resistor is equal to ($R_S$)+($R_{C1}$)+($R_{C2}$).

34. The field emission display as claimed in claim 31 wherein the baseplate comprises glass and the first conductivity region comprises an isolated silicon island.

* * * * *

UNITED STATES PATENT AND TRADEMARK OFFICE
CERTIFICATE OF CORRECTION

PATENT NO. : 5,712,534
DATED : Jan. 27, 1998
INVENTOR(S) : John Kichul Lee; David A. Cathey, Jr.; Kevin Tjaden It is certified that error appears in the above-indentified patent and that said Letters Patent is hereby corrected as shown below:

On the title page, item [54] and Column 1, in the title, should read:

HIGH RESISTANCE RESISTORS FOR LIMITING CATHODE CURRENT IN FIELD EMISSION DISPLAYS

Signed and Sealed this

Twenty-third Day of June, 1998

Attest:

BRUCE LEHMAN

*Attesting Officer*  *Commissioner of Patents and Trademarks*